United States Patent [19]

Watanabe

[11] Patent Number: 5,603,099
[45] Date of Patent: Feb. 11, 1997

[54] TRANSCEIVER FOR PREVENTING THE DEGRADATION OF RECEPTION SENSITIVITY AND MODULATION ACCURACY OF A TRANSMITTED SIGNAL WHEN AN EXTERNAL REFERENCE SIGNAL INCORPORATES NOISE

[75] Inventor: Nozomu Watanabe, Tokyo, Japan

[73] Assignee: NEC Corporation, Tokyo, Japan

[21] Appl. No.: 265,755

[22] Filed: Jun. 27, 1994

[30] Foreign Application Priority Data

Jun. 25, 1993 [JP] Japan .................................. 5-155351

[51] Int. Cl.⁶ ........................................................ H04B 1/40
[52] U.S. Cl. .......................... 455/84; 455/260; 455/314
[58] Field of Search ............................... 455/73, 75, 76, 455/84, 85, 86, 315, 316, 318, 260, 119, 71, 314

[56] References Cited

U.S. PATENT DOCUMENTS

| | | | |
|---|---|---|---|
| 4,027,242 | 5/1977 | Yamanaka | 455/76 |
| 4,035,727 | 7/1977 | Ishii | 325/184 |
| 4,153,877 | 5/1979 | Fathauer et al. | 325/25 |
| 4,727,594 | 2/1988 | Ruppel | 455/314 X |
| 4,817,197 | 3/1989 | Shimizu et al. | 455/314 X |
| 5,081,705 | 1/1992 | Swanke | 455/260 X |
| 5,115,515 | 5/1992 | Yamamoto et al. | 455/71 |
| 5,204,975 | 4/1993 | Shigemori | 455/231 |

FOREIGN PATENT DOCUMENTS 0398688  11/1990  European Pat. Off. .

Primary Examiner—Reinhard J. Eisenzopf
Assistant Examiner—Philip J. Sobutka
Attorney, Agent, or Firm—Sughrue, Mion, Zinn, Macpeak & Seas

[57] ABSTRACT

A transmitter/receiver has a superheterodyne receiver, a transmitter, a local oscillation signal generating section for transmission, a first and a second local oscillation signal generating section for reception, and a fixed frequency divider. A reference signal fed from the outside of the transmitter/receiver is applied to the second reception local oscillation signal generating section having a low loop gain. The output of the second reception local oscillation signal generating section is applied to the fixed frequency divider as well as to the receiver. The resulting output of the fixed frequency divider is fed as a reference signal meant for the transmission local oscillation signal generating section and first reception local oscillation signal generating section. The transmitter/receiver prevents the modulation accuracy of a signal to be transmitted and reception sensitivity from being degraded even when the reference signal introduced from the outside involves noise.

3 Claims, 5 Drawing Sheets

TRANSCEIVER FOR PREVENTING THE DEGRADATION OF RECEPTION SENSITIVITY AND MODULATION ACCURACY OF A TRANSMITTED SIGNAL WHEN AN EXTERNAL REFERENCE SIGNAL INCORPORATES NOISE

BACKGROUND OF THE INVENTION

The present invention relates to a transmitter/receiver having a superheterodyne receiver and, more particularly, to a transmitter/receiver which prevents the modulation accuracy of a signal to be transmitted and reception sensitivity from being degraded even when a reference signal fed from the outside involves noise.

There has been known a transmitter/receiver made up of a superheterodyne receiver, a transmitter, a local oscillation signal generating section for transmission, and a first and a second local oscillation signal generating section for reception. The local oscillation signal generating sections are each implemented as a phase locked loop (PLL) frequency synthesizer. The PLL synthesizer has a voltage controlled oscillator (VCO), a variable frequency divider for sequentially dividing the output frequencies of the VCO, a phase comparator for comparing the phase of the output of the frequency divider with that of a reference signal, and a low pass filter for smoothing the output of the phase comparator to thereby produce a control signal. Controlled by this control signal, the VCO outputs a signal synchronous to the reference signal. The transmission and first reception local oscillation signal generating sections are each implemented by a PLL capable of switching the frequency rapidly, i.e., having a high loop gain since it has to change the frequency in association with a transmission frequency or a reception frequency. Conversely, the second reception local oscillation signal generating section is implemented by a PLL having a low loop gain since the frequency thereof needs only to be constant.

The conventional transmitter/receiver has a problem left unsolved, as follows. When the reference signal from the outside involves noise, the transmission and first reception local oscillation signal generating sections cannot remove the noise due to their high loop gains. As a result, the transmission and first reception local oscillation signal s from such sections are unstable and low in carrier-to-noise (C/N) characteristic, degrading the modulation accuracy of a signal to be transmitted as well as a reception characteristic.

SUMMARY OF THE INVENTION

It is, therefore, an object of the present invention to provide a transmitter/receiver capable of preventing the stability of the frequencies of local oscillation signals for transmission and reception and C/N characteristic from being degraded even when a reference signal introduced from the outside involves noise.

A transmitter/receiver made up of a superheterodyne receiver and a transmitter of the present invention comprises a transmission local oscillation signal generating section for feeding a transmission local oscillation signal to the transmitter, a first reception local oscillation signal generating section for feeding a first reception local oscillation signal to a first IF amplifying stage included in the receiver, a second reception local oscillation signal generating section for feeding a second reception local oscillation signal synchronous to an external reference signal, which is received from the outside of the transmitter/receiver, to a second IF amplifying stage also included in the receiver, and a fixed frequency divider for receiving the second reception local oscillation signal which branches off the second reception local oscillation signal generating section. The output of the fixed frequency divider is applied to the transmission local signal generating section and first reception local signal generating section as a reference signal.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
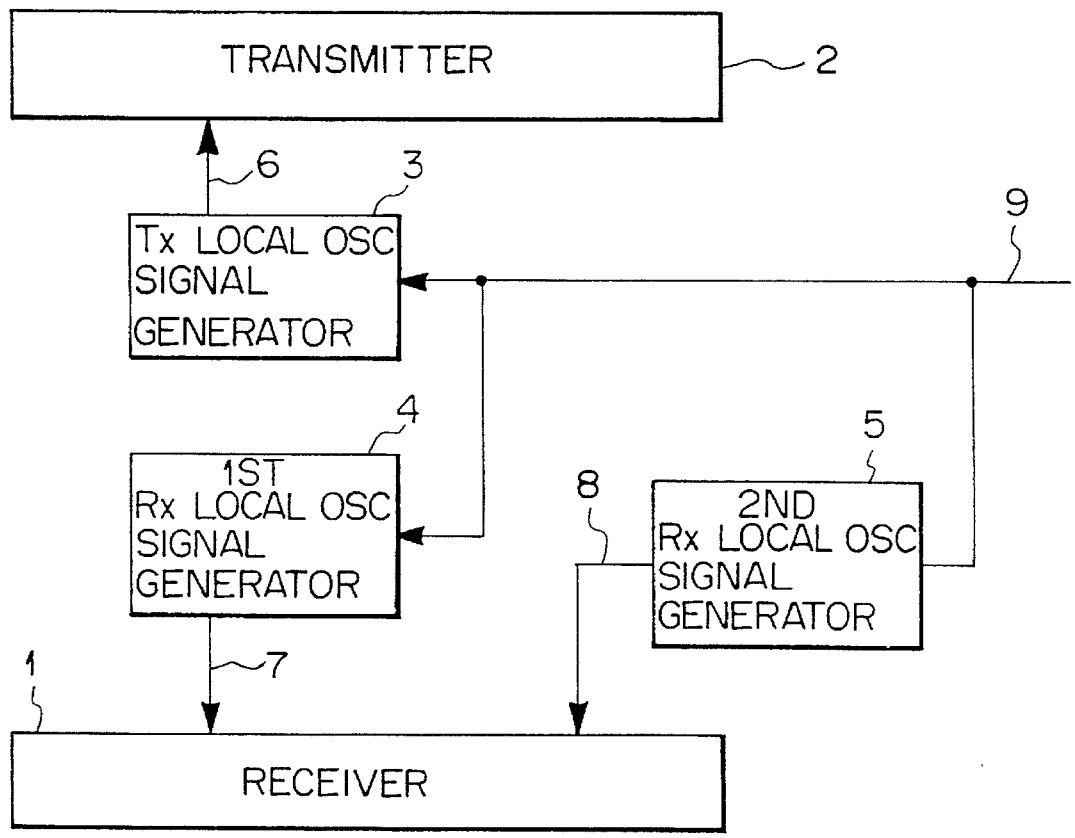
FIG. 1 is a block diagram schematically showing a conventional transmitter/receiver having a superheterodyne receiver.
Figure 2:
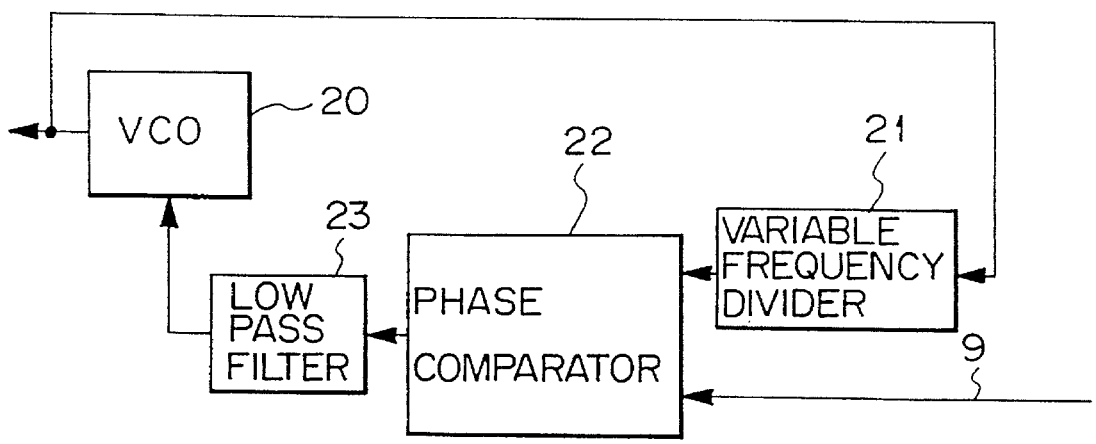
FIG. 2 is a schematic block diagram of a PLL frequency synthesizer included in the transmitter/receiver of FIG. 1 and implementing a local oscillation signal generating section.

To better understand the present invention, a brief reference will be made to a conventional transmitter/receiver, shown in FIG. 1. As shown, the transmitter/receiver has a superheterodyne receiver 1, a transmitter 2, a transmit (Tx) local oscillation signal generating section 3, a first receive (Rx) local oscillation signal generating section 4, and a second Rx local oscillation signal generating section 5. A reference signal 9 is fed to the local oscillation signal generating sections 3, 4 and 5 from the outside of the transmitter/receiver. Among the local oscillation signal generating sections 3–5, the section 3 generates a Tx local oscillation signal 6 and applies it to the transmitter 2 for converting a baseband signal to be transmitted to an RF signal. The section 4 generates a first Rx local oscillation signal 7 and delivers it to the receiver 1 for converting a received RF signal to a first IF signal. Further, the section 5 generates a second Rx local oscillation signal 8 and feeds it to the receiver 1 for transforming the first IF signal to a second IF signal. As shown in FIG. 2, these sections 3, 4 and 5 are each implemented as a PLL frequency synthesizer. The PLL synthesizer is made up of a VCO 20, a variable frequency divider 21 for sequentially dividing the output frequencies of the VCO 20, a phase comparator 22 for comparing the phase of the output of the frequency divider 21 with that of the reference signal 9, and a low pass filter 23 for smoothing the output of the phase comparator 22 to thereby produce a control signal. Controlled by this control signal, the VCO 20 outputs a signal synchronous to the reference signal 9. The local oscillation signal generating sections 3 and 4 are each implemented by a PLL capable of switching the frequency rapidly, i.e., having a high loop gain since it has to change the frequency in association with a transmission frequency or a reception frequency. Conversely, the local oscillation signal generating section 5 is implemented by a PLL having a low loop gain since the frequency thereof needs only to be constant. The reference signal 9 is fed to the phase comparator 22 from the outside of the transmitter/receiver; the local oscillation signal is synchronous to the reference signal 9.

The problem with the conventional transmitter/receiver is that when the reference signal involves noise, the local oscillation signal generating sections 3 and 4 cannot remove the noise due to their high loop gains. As a result, the local oscillation signals 6 and 7 from these sections 3 and 4 are unstable and low in C/N characteristic degrading the modulation accuracy of a signal to be transmitted as well as a reception characteristic.

Figure 3:
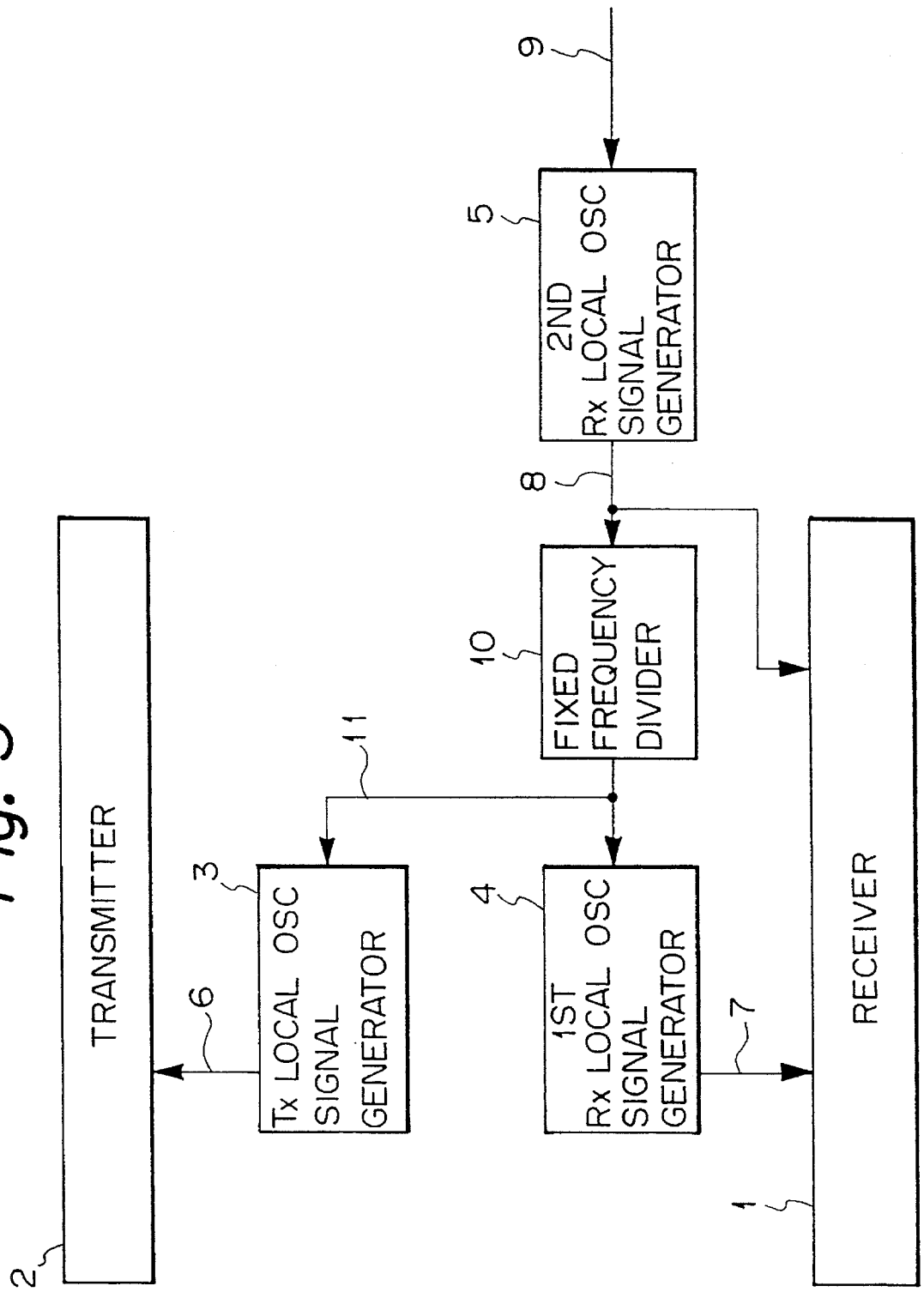
FIG. 3 is a schematic block diagram showing a transmitter/receiver embodying the present invention.
Figure 4A:
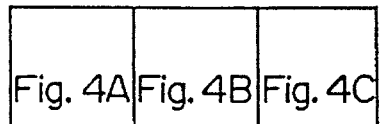
FIG. 4a–c are block diagram-showing the embodiment more specifically.
Figure 4A:
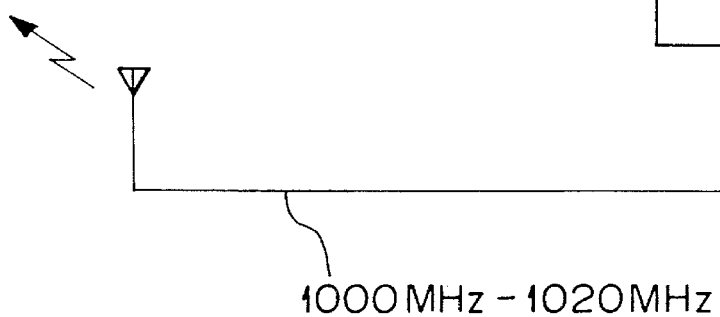
Figure 4A:
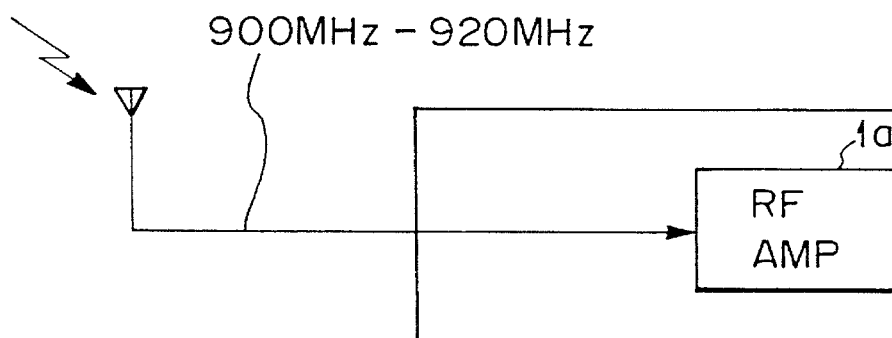
Figure 4B:
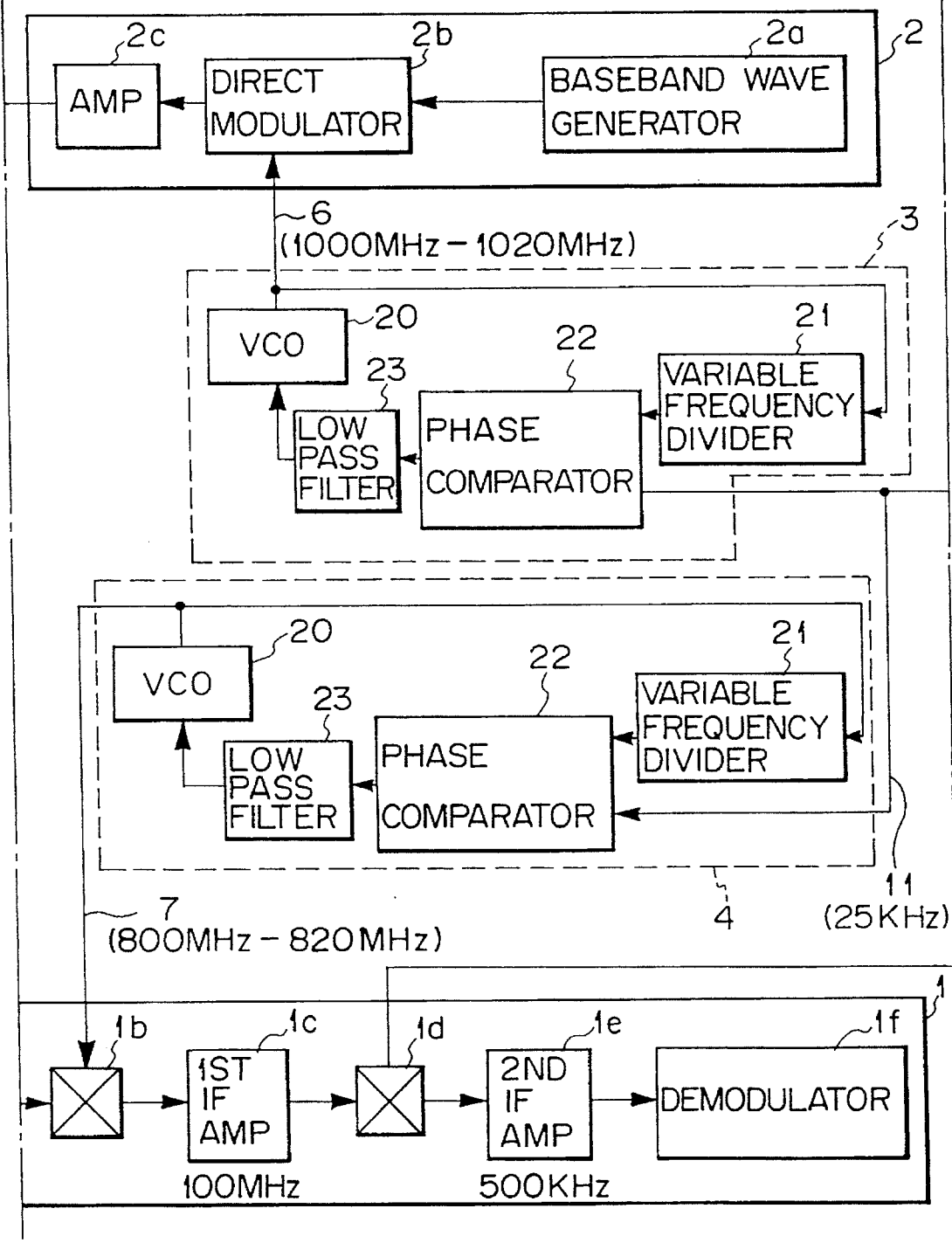
Figure 4C:
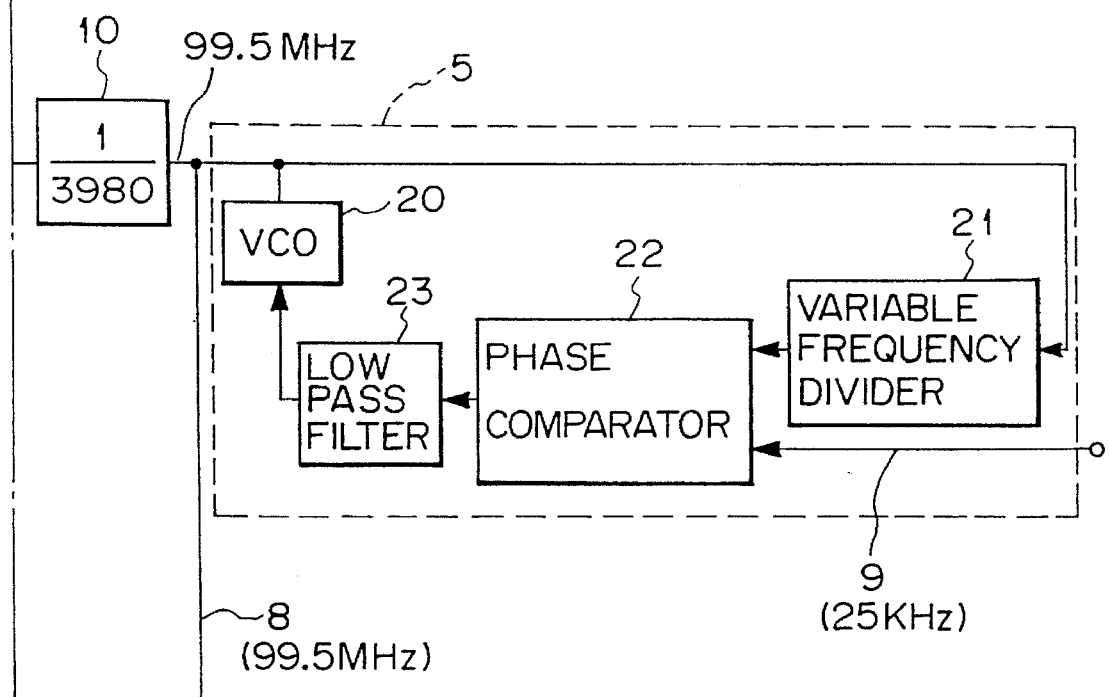

Referring to FIGS. 3 and 4 a transmitter/receiver embodying the present invention will be described. In the figures, constituent parts which are similar to the parts shown in FIGS. 1 and 2 are designated by the same reference numerals, and a detailed description thereof will not be made in order to avoid redundancy. As shown, in the illustrative embodiment, a reference signal 9 from the outside is fed only to a second Rx local oscillation signal generating section 5. The output of the second Rx local oscillation signal generating section 5 branches off to a fixed frequency divider 10 and a receiver 1. The fixed frequency divider 10 has an output 11 thereof connected to a Tx local oscillation signal generating section 3 and a first Rx local oscillation signal generating section 4. In this configuration, the second Rx local oscillation signal generating section 5 generates a second local oscillation signal 8 for reception. This signal 8 has the frequency thereof divided by the fixed frequency divider 10. The resulting output 11 of the frequency divider 10 plays the role of a reference signal meant for the local oscillation signals 3 and 4.

For each of the local oscillation signal generating sections 3, 4 and 5, use is also made of the PLL frequency synthesizer shown in FIG. 2. Specifically, the reference signal 9 from the outside is input to the phase comparator 22 of the second Rx local oscillation signal generating section 5. Since the second Rx local oscillation signal 8 for reception should only have a fixed frequency, the local oscillation signal generating section 5 may generally have an extremely low loop gain. Hence, this section, or PLL, 5 produces an output free from the influence of noise which is entrained by the reference signal 9.

Assume that the reference signal 9 has a frequency $f_{REF}$, and that the variable frequency divider 21, FIG. 2, has a denominator N. Then, the frequency $f_{R2}$ of the second local oscillation signal 8 for reception is expressed as:

$$F_{R2}=f_{REF} \times N$$

The signal 8 is applied to the receiver 1 on one hand and to the fixed frequency divider 10 on the other hand. Assuming that the fixed frequency divider 10 has a denominator N, the output 11 of the frequency divider 10 has a frequency $f_n$ produced by:

$$f_N=f_{R2}/N=f_{REF}$$

It follows that the signal 11 has the same frequency as the reference signal 9 and has had the noise removed by the second Rx local oscillation signal generating section, or PLL, 5.

The signal 11 is applied to the phase comparator 22, FIG. 2, included in each of the local oscillation signal generating sections 3 and 4 as a reference signal. The local oscillation signal generating sections 3 and 4 are each implemented by a PLL having a high loop gain since it has to switch the frequency rapidly in association with the frequency for transmission or reception. However, since the reference signal 11 applied to these sections 3 and 4 is free from noise components, the local oscillation signals 6 and 7 from the sections 3 and 4 are stable in frequency and desirable in C/N characteristic. The denominator N of the fixed frequency divider 10 may be 2N in place of N, in which case the signals 6 and 7 will each have a frequency whose minimum variable interval is $f_{REF}/2$.

Referring to FIG. 4, a more specific construction of the embodiment is shown. The transmitter/receiver is assume to have a reception frequency ranging from 900 MHz to 920 MHz and a transmission frequency ranging from 1000 MHz to 1020 MHz and have channel intervals of 25 kHz. As shown in FIG. 4, the receiver 1 has an RF amplifier 1a, a first mixer 1b, a first IF amplifier 1c, a second mixer 1d, a second IF amplifier 1e, and a demodulator 1f. The transmitter 2 has a baseband waveform generator 2a, a direct modulator 2b, and an amplifier 2c. The first and second IF frequencies are 100 MHz and 500 kHz, respectively. The Tx local oscillation signal 6, first Rx local oscillation signal 7 and second Rx local oscillation signal 8 respectively have frequencies of 1000 MHz to 1020 MHz, 800 MHz to 820 MHz, and 99.5 MHz. Since the second Rx local oscillation signal generating section 5 needs only a fixed oscillation frequency, the VCO 20 thereof is provided with control voltage sensitivity of as low as 1 ppm/V; the PLL also has an extremely low loop gain. By contrast, in each of the Tx local oscillation signal generating section 3 and first Rx local oscillation signal generating section 4, the VCO 20 is provided with control voltage sensitivity of about 10 MHz in order to cover a 20 MHz band; the PLL also has a loop gain high enough to effect rapid frequency switching. The reference signal 9 from the outside is applied to the second Rx local oscillation signal generating section 5. The 99.5 MHz second Rx local oscillation signal 8 from the section 5 is applied to both the second mixer 1d of the receiver 1 and the fixed frequency divider 10 having a denominator N of 3980.

In the above condition, the output signal 11 of the fixed frequency divider 10 has a frequency $f_N$ produced by:

$$f_N=99.5(MHz)/3980=25(kHz)$$

The signal 11 is fed to the Tx local oscillation signal generating section 3 and first Rx local oscillation signal generating section 4. As a result, the frequency of the Tx local oscillation signal 6 is variable over a range of from 1000 MHz to 1020 MHz at intervals of 25 kHz in association with the transmission frequency. Likewise, the frequency of the Rx local oscillation signal 7 is variable over a range of from 800 MHz to 820 MHz at intervals of 25 kHz in association with the reception frequency. The signals 6 and 7 are respectively applied to the direct modulator 2b of the transmitter 2 and the first mixer 1b of the transmitter 1.

In summary, it will be seen that the present invention provides a transmitter/receiver which generates, even when a reference signal introduced from the outside involves noise, local oscillation signals which are stable and desirable in C/N characteristic. Such local oscillation signals prevent modulation accuracy for transmission and reception sensitivity from being degraded. This advantage is derived from a unique arrangement wherein the reference signal from the outside is fed only to a second reception local oscillation signal generating section whose loop gain is low, while a reference signal for the other local oscillation signal generating sections is produced by dividing the frequency of a second reception local oscillation signal.

Various modifications will become possible for those skilled in the art after receiving the teachings of the present disclosure without departing from the scope thereof.

What is claimed is:

1. A transmitter/receiver comprising:

a superheterodyne receiver including a first and a second intermediate frequency (IF) amplifying stage;

a transmitter;

a transmission local oscillation signal generator for feeding a transmission local oscillation signal to said transmitter;

a first reception local oscillation signal generator for feeding a first reception local oscillation signal to the first intermediate frequency (IF) amplifying stage;

a second reception local oscillation signal generator for feeding a second reception local oscillation signal which is synchronized to an external reference signal, and which is provided to the second IF amplifying stage, said external reference signal being provided from outside of said transmitter/receiver, said second local reception local oscillation signal generator having a low-loop gain; and a fixed frequency divider for receiving said second reception local oscillation signal which branches off from said second reception local oscillation signal generator, an output of said fixed frequency divider being applied to said transmission local signal generator and said first reception local signal generator as a reference signal.

2. A transmitter/receiver as claimed in claim 1, wherein said transmission local oscillation signal generator, said first reception local signal generator and said second reception local oscillation signal generator each comprises a phase-locked loop (PLL) frequency synthesizer; said PLL frequency synthesizer comprising:

a voltage controlled oscillator (VCO):

a variable frequency divider for sequentially dividing output frequencies of said VCO;

a phase comparator for comparing a phase of an output of said variable frequency divider and a phase of said reference signal; and a low pass filter for smoothing an output of said phase comparator to produce a control signal and for feeding said control signal to said VCO.

3. A transmitter/receiver as claimed in claim 2, wherein said external reference signal has a frequency of 25 kHz, said first reception local oscillation signal having a frequency ranging from 800 MHz to 820 MHz, said second reception local oscillation signal having a frequency of 99.5 MHz, and the output of said fixed frequency divider having a frequency of 25 kHz.

* * * * *